United States Patent
Ito et al.

(10) Patent No.: US 8,957,486 B2
(45) Date of Patent: Feb. 17, 2015

(54) MAGNETIC MEMORY

(75) Inventors: Kenchi Ito, Kunitachi (JP); Jun Hayakawa, Hino (JP); Katsuya Miura, Sendai (JP); Hiroyuki Yamamoto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 428 days.

(21) Appl. No.: 13/147,820

(22) PCT Filed: Mar. 4, 2009

(86) PCT No.: PCT/JP2009/054070
§ 371 (c)(1),
(2), (4) Date: Aug. 4, 2011

(87) PCT Pub. No.: WO2010/100728
PCT Pub. Date: Sep. 10, 2010

(65) Prior Publication Data
US 2012/0012955 A1    Jan. 19, 2012

(51) Int. Cl.
*H01L 29/82* (2006.01)

(52) U.S. Cl.
USPC .......................................... 257/421; 257/422

(58) Field of Classification Search
USPC ................ 257/421, 422, E21.665, E29.323
See application file for complete search history.

(56) References Cited

U.S. PATENT DOCUMENTS 5,734,605 A    3/1998    Zhu et al.
7,982,275 B2 *  7/2011    Nagai et al. ................... 257/421

(Continued)

FOREIGN PATENT DOCUMENTS

EP    1 182 713    2/2002
EP    1 933 338    6/2008

(Continued)

OTHER PUBLICATIONS

European Search Report, EP Application No. 09841093.9, Dec. 12, 2013.

(Continued)

*Primary Examiner* — Hung Vu
(74) *Attorney, Agent, or Firm* — Antonelli, Terry, Stout & Kraus, LLP.

(57) ABSTRACT

Provided is a magnetic random access memory to which spin torque magnetization reversal is applied, the magnetic random access memory being thermal stable in a reading operation and also being capable of reducing a current in a wiring operation. A magnetoresistive effect element formed by sequentially stacking a fixed layer, a nonmagnetic barrier layer, and a recording layer is used as a memory element. The recording layer adopts a laminated ferrimagnetic structure. The magnetic memory satisfies the expression $M_s^2(t/w) > |J_{ex}| > (2k_B T \Delta)/S$, in which $k_B$ is a Boltzmann constant, T is an operating temperature of the magnetic memory, S is an area parallel to a film surface of the magnetoresistive effect element, t and $M_s$ are respectively a film thickness and a saturated magnetization of the ferromagnetic layer having a smaller film thickness among two ferromagnetic layers which are constituent members of the laminated ferrimagnetic structure, w is a length of a short side of the recording layer, $\Delta$ is a thermal stability index of the magnetic memory, and $J_{ex}$ is exchange coupling energy acting between the two ferromagnetic layers of the recording layer.

8 Claims, 14 Drawing Sheets

(56) References Cited

U.S. PATENT DOCUMENTS

| | | |
|---|---|---|
| 8,445,980 B2 * | 5/2013 | Higo et al. .................... 257/421 |
| 2004/0165425 A1 | 8/2004 | Nakamura et al. |
| 2005/0219767 A1 | 10/2005 | Nakamura et al. |
| 2007/0096229 A1 | 5/2007 | Yoshikawa et al. |
| 2007/0109692 A1 | 5/2007 | Carey et al. |
| 2007/0253118 A1 | 11/2007 | Hayakawa et al. |
| 2008/0197431 A1 | 8/2008 | Morise et al. |
| 2008/0253174 A1 | 10/2008 | Yoshikawa et al. |
| 2008/0310216 A1 | 12/2008 | Miura |

FOREIGN PATENT DOCUMENTS

| | | |
|---|---|---|
| JP | 2004-193595 | 7/2004 |
| JP | 2005-174969 | 6/2005 |
| JP | 2005-294376 | 10/2005 |
| JP | 2007-012696 | 1/2007 |
| JP | 2007-142393 | 6/2007 |
| JP | 2007-150265 | 6/2007 |
| JP | 2007-281247 | 10/2007 |
| JP | 2007-294737 | 11/2007 |
| JP | 2007-317734 | 12/2007 |
| JP | 2008-198900 | 8/2008 |
| JP | 2008-311321 | 12/2008 |

OTHER PUBLICATIONS

Office Action in JP 2011-502534, issued Apr. 2, 2013 (in Japanese, 4 pgs.), {English language translation 4 pgs.}.

J. C. Slonczewski, Current-driven excitation of magnetic multilayers, Journal Of Magnetism and Magnetic Materials 159(1996), pp. L1-L7.

J. A. Katine et al., Current-Driven Magnetization Reversal and Spin-Wave Excitations in Co/Cu/Co Pillars, Physical Review Letters, Apr. 3, 2000, pp. 3149-3152, vol. 84, No. 14.

Yiming Huai et al., Observation of spin-transfer switching in deep submicron-sized and low-resistance magnetic tunnel junctions, applied Physics Letters, Apr. 19, 2004, pp. 3118-3120, vol. 84, No. 16.

* cited by examiner (a)  (b)

(a)

(b)

MAGNETIC MEMORY

TECHNICAL FIELD

The present invention relates to a magnetic memory and a magnetic random access memory to which spin torque magnetization reversal is applied.

BACKGROUND ART

In recent years, a magnetic random access memory (MRAM) having a potential to replace a conventional dynamic random access memory (DRAM) has been drawing attention. As described in U.S. Pat. No. 5,734,605, for example, a conventional MRAM adopts a recording method by reversing a magnetization of one end of a tunnel magnetoresistive effect (TMR) element by use of a synthetic magnetic field created by a current flowing through two metal lines provided in mutually orthogonal directions above and below the TMR element. Here, the tunnel magnetoresistive effect (TMR) element has a multilayer structure of a magnetic film/a nonmagnetic insulating film/a magnetic film. However, even in the MRAM, there is pointed out a problem that the magnitude of the magnetic field required for the magnetization reversal is increased when the size of the TMR element is reduced in order to achieve higher capacity, so that it is necessary to feed a large amount of the current through the metal lines which may incur an increase in power consumption and lead to destruction of the lines eventually.

As a method of achieving magnetization reversal without using the magnetic field, it has been theoretically explained that the magnetization reversal is possible only by feeding a current in a certain amount or larger to a giant magnetoresistive effect (GMR) film or the tunnel magnetoresistive effect (TMR) film as used in a magnetic reproducing head as described in Journal of Magnetism and Magnetic Materials, 159, L1-6 (1996), for example. Thereafter, there has been reported in Physical Review Letters, Vol. 84, No. 14, pp. 2149-2152 (2000), for example, an experiment example of a recording method including: forming pillars having a diameter of 130 nm and containing a Co/Cu/Co multilayer film (a GMR film) between two Cu electrodes; feeding a current through the pillars; and reversing a magnetization of a Co layer by using spin torque given from spin of the flowing current to the magnetization of the Co layer. Furthermore, in recent years, spin torque magnetization reversal using nanopillars using a TMR film has been proven as described in Applied Physics Letters, Vol. 84, pp. 2118-2120 (2004), for example. Particularly, the spin torque magnetization reversal using the TMR film is drawing a lot of attention because it is possible to obtain an output equal to or above that from a conventional MRAM.

FIGS. 1(a) and 1(b) show schematic diagrams of the above-described spin torque magnetization reversal. In FIGS. 1(a) and 1(b), a magnetoresistive effect element and a transistor 6 under conduction control by a gate electrode 5 are connected to a bit line 1. Here, the magnetoresistive effect element includes a first ferromagnetic layer (a recording layer) 2 having a variable magnetization direction, an intermediate layer 3, and a second ferromagnetic layer (a fixed layer) 4 having a fixed magnetization direction. Meanwhile, another terminal of the transistor is connected to a source line 7. As shown in FIG. 1(a), a current 8 is caused to flow from the bit line 1 to the source line 7 for changing the magnetizations between the fixed layer 4 and the recording layer 2 from an antiparallel (high-resistance) state to a parallel (low-resistance) state. At this time, electrons 9 flow from the source line 7 to the bit line 1. On the other hand, as shown in FIG. 1(b), the current 8 may be caused to flow in the direction from the source line 7 to the bit line 1 for changing the magnetizations between the fixed layer 4 and the free layer 2 from the parallel (low-resistance) state to the antiparallel (high-resistance) state. At this time, the electrons 9 flow in the direction from the bit line 1 to the source line 7.

Then, as described in Japanese Patent Application Publication No. 2005-294376, for example, there has been proposed a structure called a laminated ferrimagnetic structure in which the recording layer 2 is formed of two ferromagnetic layers 21 and 23 sandwiching a nonmagnetic layer 22 therebetween and orientations of magnetizations of the ferromagnetic layers 21 and 23 are arranged in mutually opposite directions, thereby attaining stabilization against a magnetic field that breaks in from outside.

Patent Document 1: U.S. Pat. No. 5,734,605
Patent Document 2: Japanese Patent Application Publication No. 2005-294376
Non-Patent Document 1: Journal of Magnetism and Magnetic Materials, 159, L1-6 (1996)
Non-Patent Document 2: Physical Review Letters, Vol. 84, No. 14, pp. 2149-2152 (2000)
Non-Patent Document 3: Applied Physics Letters, Vol. 84, pp. 2118-2120 (2004)

DISCLOSURE OF THE INVENTION

Problems to be Solved by the Invention

However, these conventional MRAMs have the following problem.

In the magnetic memory to which spin torque magnetization reversal is applied, it is extremely important to reduce a rewriting current and ensure thermal stability that guarantees non-volatility. It is known that the rewriting current in the spin torque magnetization reversal is determined by the current density. According to Physical Review B, Vol. 62, No. 1, pp. 570-578, for example, it is known that a threshold current density $J_{c0}$ is given by the following formula (1):

$$J_{c0} \propto (\alpha M_s t/g)(H_k + M_{eff}/2\mu_0) \sim (\alpha M_{eff} M_s t)/2\mu_0 g)(H_k \ll M_{eff}/2\mu_0) \tag{1}$$

Here, $\alpha$ is the Gilbert damping constant, $M_s$ is a saturated magnetization of a recording layer, t is a film thickness of the recording layer, g is spin torque efficiency, $H_k$ is an anisotropic magnetic field of the recording layer, $M_{eff}$ is an effective magnetization of the recording layer after subtracting a demagnetizing field effect acting in a perpendicular direction to a film surface, and $\mu_0$ is magnetic permeability of vacuum.

In the meantime, an energy barrier characterizing the thermal stability, or namely energy required for magnetization reversal between two stable magnetization directions is given by the following formula (2). Here, S is an area which is parallel to a film surface of a magnetoresistive effect element (a TMR element).

$$E \sim (1/2) \times (M_s H_k S t) \tag{2}$$

As apparent from the formula (1) and the formula (2), both of $J_{c0}$ and E are amounts which are proportional to $M_s \cdot t$. Therefore, $J_{c0}$ becomes greater if $M_s \cdot t$ is increased in order to ensure the thermal stability. Hence the power consumption required for writing is increased. On the other hand, E becomes smaller if $M_s \cdot t$ is decreased in order to reduce the threshold current. Hence the thermal stability is degraded. That is to say, $J_{c0}$ and E are in a trade-off relationship.

Meanwhile, Japanese Patent Application Publication No. 2005-294376 discloses a MRAM using a laminated ferrimagnetic recording layer. As shown in FIG. 2, the recording layer 2 is formed of the two magnetic layers 21 and 23 which are coupled in an antiparallel fashion while sandwiching the nonmagnetic layer 22 therebetween. In this case, since the orientations of magnetizations of the two magnetic layers 21 and 23 which are constituent members of the recording layer are in mutually opposite directions, the recording layer has an advantage that it is possible to reduce a net value of the magnetization $M_s \cdot t$ having a vector action effective for the spin torque magnetization reversal and to reduce $J_{c0}$. In the meantime, the magnetic layer 2 becomes thermally stable due to the increase in volume because a sum of magnetizations of the two magnetic layers 21 and 23 applies to $M_s \cdot t$ in the formula (2), which expresses the thermal stability. That is, the laminated ferrimagnetic recording layer has the structure which can achieve low $J_{c0}$ and high E at the same time. However, these effects cannot be achieved unless the magnetizations of the two magnetic layers 21 and 23 in the laminated ferrimagnetic recording layer 2 are precisely antiparallel. However, in many actual elements, the magnetizations of the two magnetic layers 21 and 23 in the laminated ferrimagnetic recording layer 2 are not precisely antiparallel due to influences of a leakage magnetic field from the fixed layer 4, interlayer coupling acting between the fixed layer 4 and the recording layer 2, and the like. Moreover, there is also a problem of fluctuation of a magnetization angle among the TMR elements constituting a memory array.

Means for Solving the Problem

A magnetic memory according to the present invention comprises a magnetoresistive effect element formed by sequentially stacking a fixed layer, a nonmagnetic barrier layer, and a recording layer. The recording layer employs a laminated ferrimagnetic structure in which a first ferromagnetic layer is antiferromagnetically coupled with a second ferromagnetic layer via a nonmagnetic layer. The magnetic memory is configured to record information based on a relationship (parallel, antiparallel) between a magnetization direction of the first ferromagnetic layer disposed on the close side to the nonmagnetic barrier layer among the first and second ferromagnetic layers which are constituent members of the recording layer, and a magnetization direction of the fixed layer. The magnetic memory is configured to switch a magnetization direction of the recording layer using a spin-polarized current applied in a direction perpendicular to a film surface of the recording layer. Here, the magnetic memory satisfies the following expression (3) in which $k_B$ is a Boltzmann constant, T is an operating temperature of the magnetic memory, S is an area parallel to a film surface of the magnetoresistive effect element, t and $M_s$ are respectively a film thickness and a saturated magnetization of the ferromagnetic layer having a smaller film thickness among the first ferromagnetic layer and the second ferromagnetic layer, w is a length of a short side of the recording layer, $\Delta$ is a thermal stability index of the magnetic memory, and $J_{ex}$ is exchange coupling energy acting between the first ferromagnetic layer and the second ferromagnetic layer.

$$M_s^2(t/w) > |J_{ex}| > (2k_B T \Delta)/S \quad (3)$$

Alternatively, a structure having average roughness Ra equal to or below 0.15 nm is formed on any of a surface of the second ferromagnetic layer on a opposite to the nonmagnetic barrier layer and a surface located below the fixed layer so as to be substantially parallel to a direction of an axis of easy magnetization of the recording layer, the second ferromagnetic layer disposed on the far side from the nonmagnetic barrier layer among the two ferromagnetic layers which are constituent members of the laminated ferrimagnetic recording layer.

Alternatively, a third ferromagnetic layer is formed on the laminated ferrimagnetic recording layer with a nonmagnetic spacer layer interposed therebetween. A magnetization direction of the third ferromagnetic layer is substantially antiparallel to a magnetization direction of the second ferromagnetic layer disposed on the far side from the nonmagnetic barrier layer among the two ferromagnetic layers which are constituent members of the laminated ferrimagnetic recording layer. The third ferromagnetic layer is made of an alloy of any of Co, Ni, and Fe.

The magnetization of the fixed layer can be achieved by use of an exchange coupling force from an antiferromagnetic layer provided on a surface on a side opposite to the recording layer while being in contact with the fixed layer. Alternatively, the fixed layer may employ a laminated ferrimagnetic structure.

It is possible to form the fixed layer by using CoFeB, the barrier layer by using MgO, the ferromagnetic layer on the close side to the barrier layer of the recording layer by using CoFeB, and the ferromagnetic layer on the far side from the barrier layer by using $Co_xFe_{(1-x)}$. The value x is set in a range from 30% to 70%.

Furthermore, a cap layer made of any of Ru and Ta may be formed on the recording layer in such a manner as to be in contact with boundary of the recording layer.

A transistor configured to apply electricity to the magnetoresistive effect element is connected to an end of the magnetoresistive effective element. An end of the transistor is connected to a source line being connected to a first write driver circuit. An end of the magnetoresistive effect element on a side not connected to the transistor is connected to a bit line being connected to a second write driver and to an amplifier configured to amplify a read signal. A word line to control resistance of the transistor is provided, and the word line is connected to a third write driver. An axis of easy magnetization of the recording layer is preferably disposed substantially perpendicular to a direction of extension of the bit line.

Furthermore, the magnetic memory comprises: a first variable resistance element connected to one end of the bit line; a second variable resistance element connected to another end of the bit line; a first voltage applying means used for changing resistance of the first variable resistance element; and a second voltage applying means used for changing resistance of the second variable resistance element, wherein in a writing operation, a magnetization of the recording layer is reversed by using spin torque generated by supplying a current between the first voltage applying means and the second voltage applying means and supplying a spin-polarized current between the bit line and the source line.

Effect of the Invention

According to the present invention, it is possible to provide a magnetic random access memory adopting spin torque magnetization reversal in which a laminated ferrimagnetic recording layer is applied, the laminated ferrimagnetic recording layer being thermally stable when reading and capable of reducing a current when writing.

BRIEF DESCRIPTION OF THE DRAWINGS

FIGS. 1(a) and 1(b) are views showing a principle of spin torque magnetization reversal, in which FIG. 1(a) is a view showing magnetization reversal from an antiparallel state to a parallel state while FIG. 1(b) is a view showing magnetization reversal from the parallel state to the antiparallel state.

EXPLANATION OF REFERENCE NUMERALS

1 BIT LINE
2 RECORDING LAYER
3 NONMAGNETIC BARRIER LAYER
4 FIXED LAYER
5 GATE ELECTRODE
6 TRANSISTOR
7 SOURCE LINE
21 FERROMAGNETIC LAYER
22 NONMAGNETIC LAYER
23 FERROMAGNETIC LAYER
61 FOUNDATION LAYER
62 SUBSTRATE
63 PROTECTIVE FILM
81 CAP LAYER
91 SUBSTRATE
92 FOUNDATION LAYER
102 LAMINATED FERRIMAGNETIC FIXED LAYER
101 LAMINATED FERRIMAGNETIC RECORDING LAYER
103 ANTIFERROMAGNETIC LAYER
104 CAP LAYER
111 CAP LAYER
112 ADDITIONAL MAGNETIC LAYER
113 METALLIC INTERMEDIATE LAYER
121 TMR ELEMENT
122 WORD LINE
123, 125 RESISTANCE CONTROL ELEMENTS
124, 126 WORD LINES FOR CONTROLLING RESISTANCE CONTROL ELEMENT
127 MEMORY CELL
1011 FERROMAGNETIC LAYER
1012 NONMAGNETIC LAYER
1013 FERROMAGNETIC LAYER
1021 FERROMAGNETIC LAYER
1022 NONMAGNETIC LAYER
1023 FERROMAGNETIC LAYER

BEST MODES FOR CARRYING OUT THE INVENTION

First of all, a principle for obtaining a TMR element that satisfy both of high thermal stability and small $J_{c0}$ according to the present invention will be described.

Figure 1:
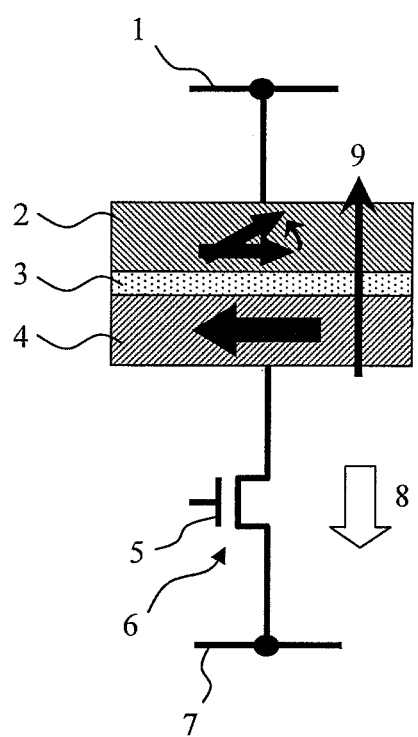
Figure 1:
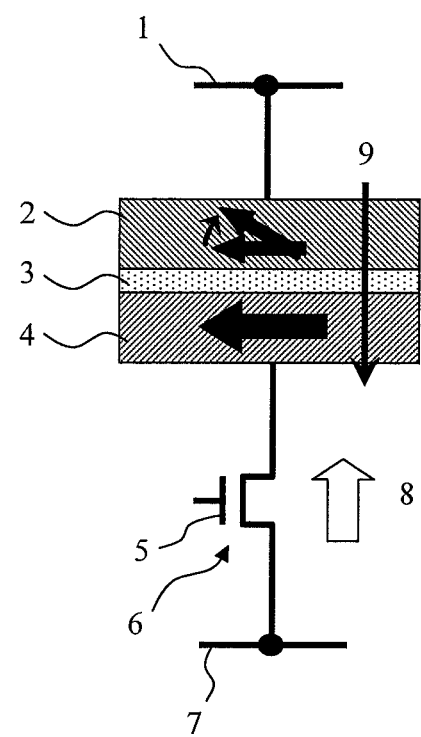
Figure 2:
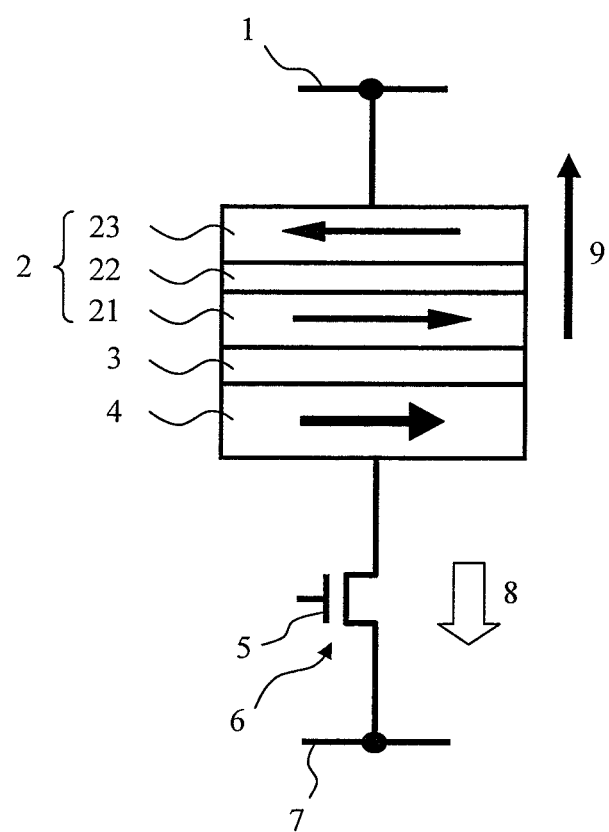
FIG. 2 is a schematic diagram showing a conventional MRAM using a laminated ferrimagnetic recording layer.
Figure 3:
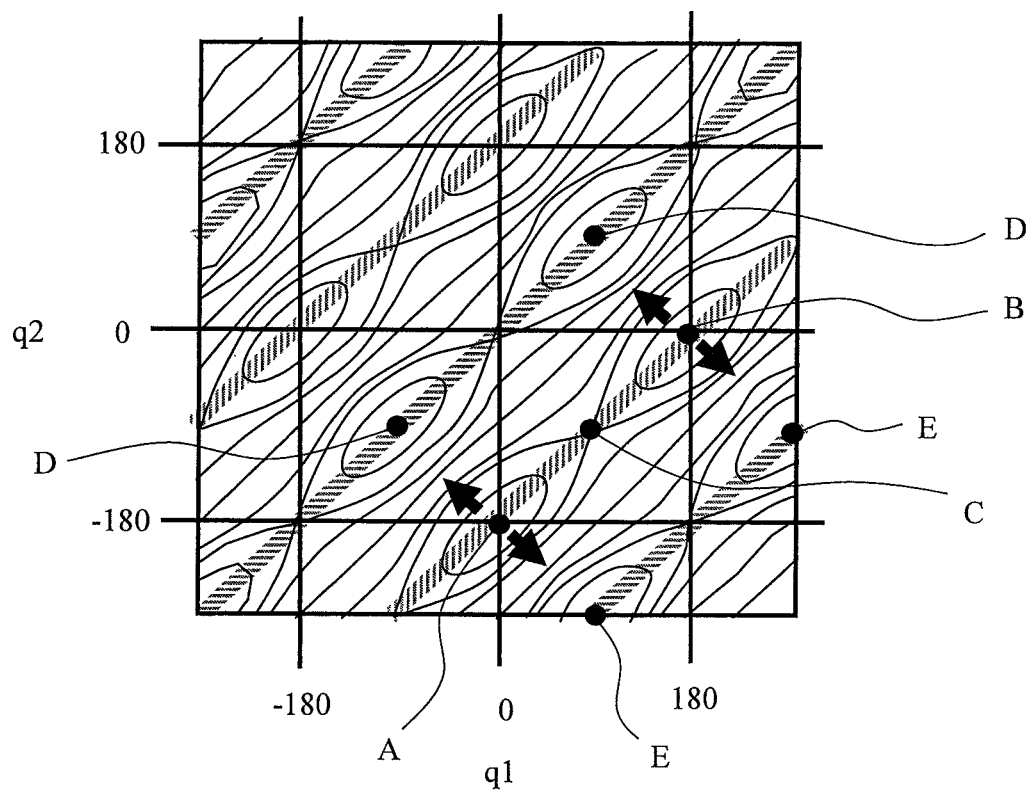
FIG. 3 is a view showing a magnetization angle and energy of the laminated ferrimagnetic recording layer.
Figure 3:
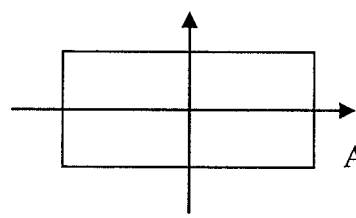

FIG. 3 is a schematic diagram of energy of the laminated ferrimagnetic recording layer of FIG. 2. As shown in a lower part of FIG. 3, a shape of the TMR element is usually formed into a structure of an ellipse, a rectangle or the like having one side longer than the other side. In this case, a longitudinal direction constitutes an axis of easy magnetization, i.e., a direction in which the orientation of magnetization is stable. Assuming that angles of magnetization of the laminated ferrimagnetic recording layer and this axis of easy magnetization are $q_1$ and $q_2$, the energy of the recording layer becomes smallest when the magnetizations of the two magnetic layers are oriented to the direction of the axis of easy magnetization while forming an angle of 180 degrees (a point A and a point B in FIG. 3) as in a case where $q_1=0$ degrees whereas $q_2=-180$ degrees or in a case where $q_1=180$ degrees whereas $q_2=0$ degrees. Meanwhile, the magnetization reversal occurs while maintaining a path shown in FIG. 3, or namely a relationship of $q_1=q_2+180$. Specifically, a point C in FIG. 3 is so-called a saddle point having energy higher than that in the point A or B but lower than that in any other energy peaks (points D, E, and the like) around the point C. An energy difference between the point A or B and the point C is equivalent to E in the formula (2). However, the energy is increased in directions of arrows in FIG. 3 when the orientations of the magnetizations of the two magnetic layers does not satisfy the relationship of $q_1=q_2+180$ due to any magnetic field. Then, the energy required to exceed the point C becomes smaller than the case where the magnetization is located in the point A or B, and thermal stability is therefore degraded. Meanwhile, as previously described, $J_{c0}$ becomes smallest when a vector sum of the two magnetizations of the recording layer is the smallest. Accordingly, $J_{c0}$ becomes smallest when the relationship of $q_1=q_2+180$ is satisfied. Therefore, when the laminated ferrimagnetic recording layer is applied to a magnetic memory, it is extremely important to consider how to achieve the relationship of $q_1=q_2+180$ accurately.

Methods of achieving the relationship of $q_1=q_2+180$ accurately include a method of increasing effective magnetic fields (an exchange coupling magnetic field acting between the two ferromagnetic layers 21 and 23, and anisotropic magnetic fields of the ferromagnetic layers 21 and 23) to be applied in the direction of the axis of easy magnetization, a method of supplying a magnetic field for compensating for a magnetic field in a direction of an axis of hard magnetization attributable to a production error of the element, and the like. Each of the methods will be described below in detail.

First Embodiment

The exchange coupling magnetic field is a magnetic field which attempts to maintain directions of the magnetizations of the two ferromagnetic films 21 and 23, which are constituent members of the laminated ferrimagnetic recording layer 2 in an antiparallel state. It is necessary to set a film thickness of the nonmagnetic film 22 interposed between the ferromagnetic films 21 and 23 to an optimum value in order to increase the exchange coupling magnetic field. This film thickness varies depending on the material or the composition of the ferromagnetic films, the material of the nonmagnetic layer, and a heat treatment temperature after film formation. In the following, a case of using $Co_xFe_yB_z$ as the material of the ferromagnetic layers 21 and 23 and using Ru as the material of the nonmagnetic layer 22 will be described. In particular, a CoFe alloy having the z value equal to about 20% can achieve a high TMR ratio when MgO is used as the material of a nonmagnetic barrier layer 3.

Figure 4:
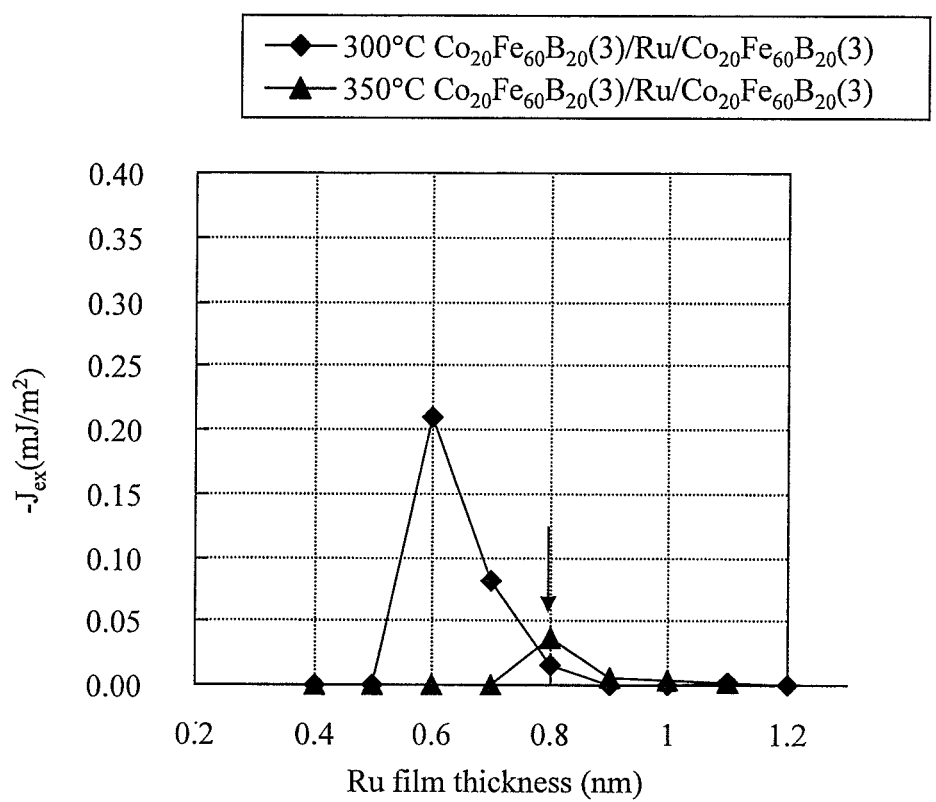
FIG. 4 is a graph showing a relationship between a Ru film thickness in the laminated ferrimagnetic recording layer and exchange coupling energy.
Figure 5:
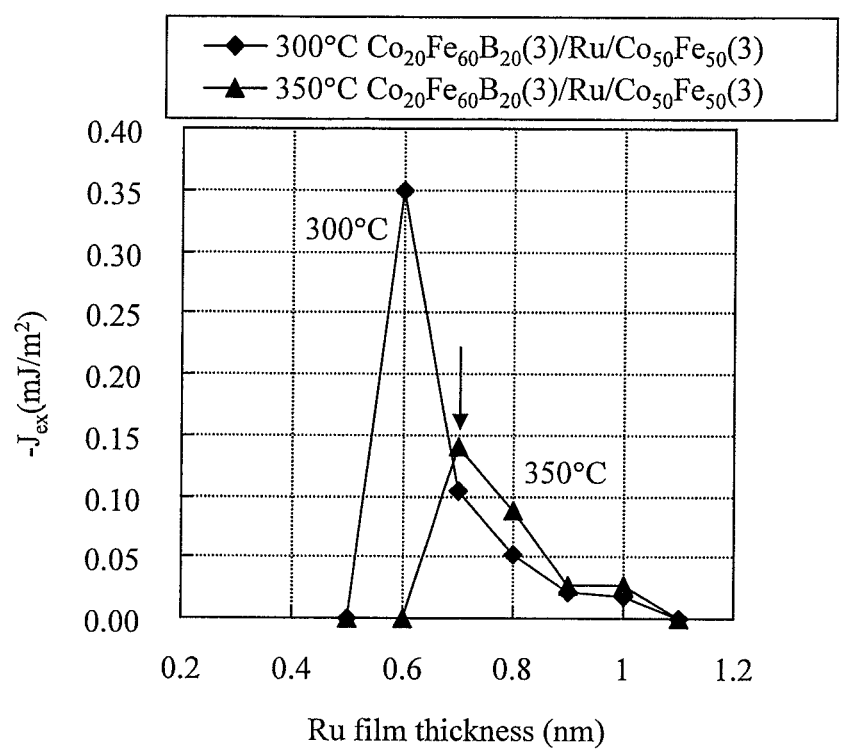
FIG. 5 is a graph showing a relationship between a Ru film thickness in the laminated ferrimagnetic recording layer and exchange coupling energy.

FIG. 4 is a graph showing a relationship between exchange coupling energy and a Ru film thickness when $Co_{20}Fe_{60}B_{20}$ is applied to both of the ferromagnetic layers 21 and 23 while Ru is applied to the nonmagnetic layer 22. A film thickness of both of the ferromagnetic films 21 and 23 is set equal to 3 nm. The optimum Ru film thickness is equal to 0.6 nm when the heat treatment temperature is set to 300° C. or is equal to 0.8 nm when the heat treatment temperature is set to 350° C. FIG. 5 is a graph showing the relationship between an exchange coupling coefficient and the nonmagnetic Ru film thickness when $Co_{50}Fe_{50}$ is applied only to the ferromagnetic layer 23. The film thickness of both of the ferromagnetic films 21 and 23 is set equal to 3 nm. In this case, it is confirmed that a value of the exchange coupling coefficient itself is large and that the optimum Ru film thickness is equal to 0.7 nm when the heat treatment temperature is set to 350° C.

Figure 6:
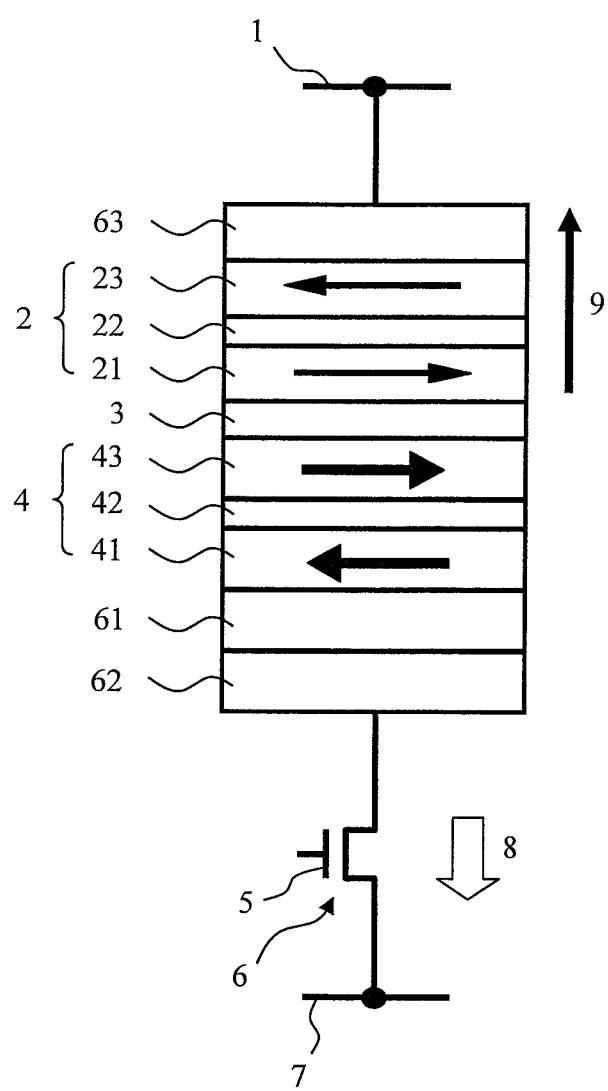
FIG. 6 is a view showing a first embodiment of the present invention.

Next, in order to confirm actual spin torque magnetization reversal characteristics, an exchange bias type TMR element as shown in FIG. 6 is produced and characteristics are evaluated. In the exchange bias type TMR element, an antiferromagnetic film 61 such as IrMn, PtMn, PdMn, FeMn or IrCrMn is formed on an appropriate foundation layer 62. Moreover, a fixed layer 4 including a laminated ferrimagnetic structure is formed on the antiferromagnetic layer 61. Here, reference numerals 41 and 43 denote ferromagnetic layers and reference numeral 42 denotes a nonmagnetic layer. This experiment shows an example of applying $Co_{50}Fe_{50}$ to the ferromagnetic layer 41, applying Ru to the nonmagnetic layer 42, and applying $Co_{20}Fe_{60}B_{20}$ to the ferromagnetic layer 43. The fixed layer 4 does not always have to include the laminated ferrimagnetic structure. However, by using the laminated ferrimagnetic fixed layer, it is possible to reduce a leakage magnetic field from the laminated ferrimagnetic fixed layer and to reduce extra magnetic field application to the recording layer 2. Hence it is possible to further improve the characteristics of spin torque magnetization reversal. A MgO layer in a thickness of 1 nm is formed as a nonmagnetic barrier layer 3 on the laminated ferrimagnetic fixed layer 4. Then, the laminated ferrimagnetic recording layer 2 including the various materials is formed thereon, and then a protective layer 63 is formed at last. After the film formation, a measurement element is prepared by cutting the TMR film into a rectangle of 100 nm×200 nm by electron beam drawing and ion beam etching.

Next, the inventors investigated as to how much $J_{ex}$ was required for achieving $q_1 \sim q_2 + 180$. As a result of extensive investigation, the inventors took note of an aspect that a deviation between the orientation of the magnetic field used for magnetizing the antiferromagnetic film 61 and the longitudinal direction of the TMR element is caused by a manufacturing error. In order to firmly fix the magnetization of the fixed layer 4 in a single direction, it is necessary to apply a large magnetic field and to magnetize the antiferromagnetic film 61 in the single direction. However, in order to equalize the size of a magnet used for the magnetic field application within a range of 200 mmφ to 300 mmφ, an extremely large-sized magnet has to be prepared for generating a large magnetic field. But a normal manufacturing line cannot prepare such a magnet in light of energy and costs required. Therefore, a smaller magnet has to be used and it is inevitable to change the magnetization direction on a wafer surface.

Figure 7:
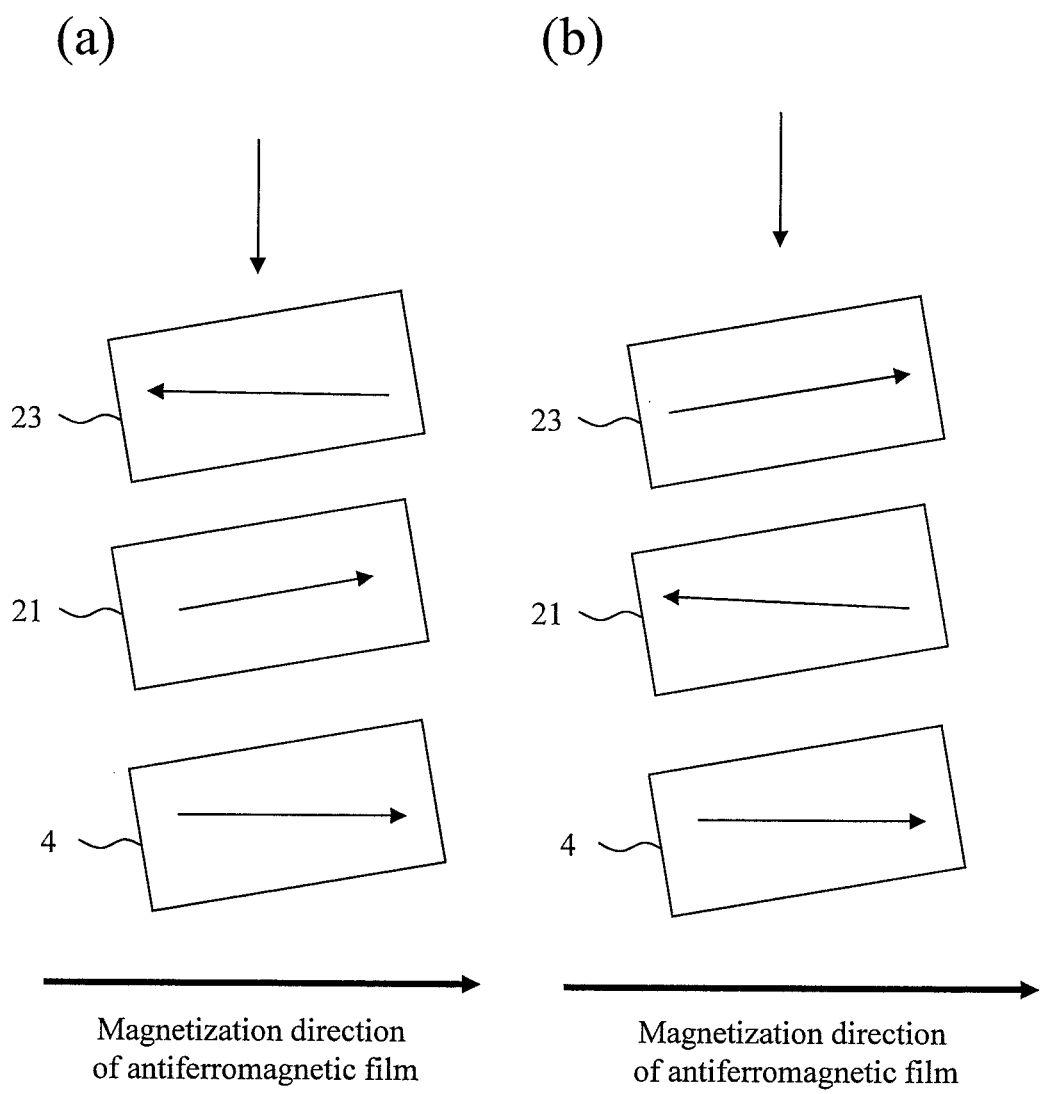
FIGS. 7(a) and 7(b) are views for explaining a reason why magnetizations of two ferromagnetic layers in a laminated ferrimagnetic recording layer do not become antiparallel.

As a case of causing the deviation between the longitudinal direction and the magnetization direction of the manufactured TMR element, when the directions of magnetizations of the fixed layer 4 and the ferromagnetic layer 21 interposing the nonmagnetic barrier layer are parallel as shown in FIG. 7(a), static magnetic field coupling acting between the two magnetizations is weak and the magnetization of the ferromagnetic layer 21 is oriented to the longitudinal direction of the element. In the meantime, the magnetization of the other ferromagnetic layer 23, which is a constituent member of the recording layer, receives an influence of the leakage magnetic field from the fixed layer 4 and tends to be oriented to a direction antiparallel to the magnetization of the fixed layer. Accordingly, the angle between the magnetizations of the ferromagnetic layer 21 and the ferromagnetic layer 23 is deviated from 180 degrees. Meanwhile, when the directions of magnetizations of the fixed layer 4 and the ferromagnetic layer 21 interposing the nonmagnetic barrier layer are antiparallel as shown in FIG. 7(b), the static magnetic field coupling acting between the two magnetizations is strong and the magnetization of the ferromagnetic layer 21 is oriented to a direction antiparallel to the magnetization of the fixed layer 4. In the meantime, the magnetization of the other ferromagnetic layer 23, which is a constituent member of the recording layer, tends to be oriented to the longitudinal direction of the element as an influence of the leakage magnetic field from the fixed layer 4 is minimal. Accordingly, the angle between the magnetizations of the ferromagnetic layer 21 and the ferromagnetic layer 23 is deviated from 180 degrees.

To prevent this, it is important to set an exchange coupling magnetic field $H_{ex}=J_{ex}/(\mu_0 \cdot M_s \cdot t)$ (in which $\mu_0$ is magnetic permeability of vacuum, $M_s$ is a saturated magnetization of the ferromagnetic layers 21 and 23, and t is a thickness) greater than an anisotropic magnetic field $H_k$ of the ferromagnetic recording layers 21 and 23 so as to achieve $q_1 \sim q_2 + 180$ under any circumstances. The anisotropic magnetic field $H_k$ of the ferromagnetic recording layers has a relationship with an energy E for guaranteeing the thermal stability expressed by $E = (\mu_0 \cdot M_s \cdot H_k \cdot S \cdot t)/2$. Accordingly, in order to render a thermal stability index $E/k_BT$ constant relative to reduction in an area S of the element, i.e., a small memory element, it is necessary to increase $H_k$ in inverse proportion to S.

In short, the exchange coupling energy $J_{ex}$ required for the area S of a certain TMR element relative to a design value $\Delta$ of $E/k_BT$ necessary for guaranteeing non-volatility in a magnetic random access memory to which the spin torque magnetization reversal is applied can be expressed as follows:

$$|J_{ex}| > (2k_BT\Delta)/S$$

Figure 14:
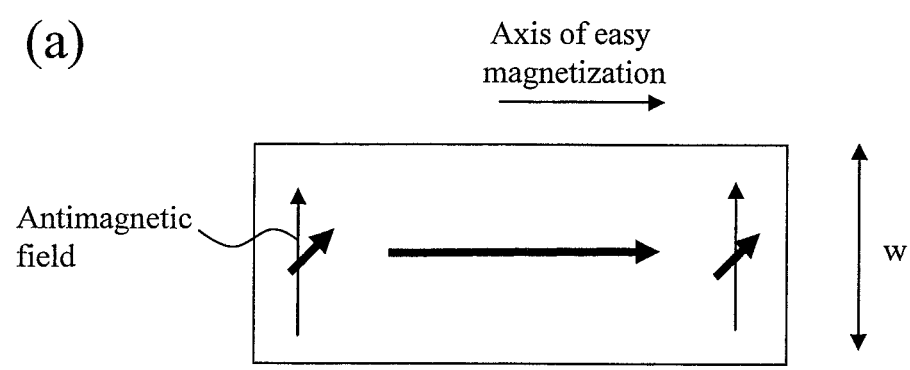
FIGS. 14(a) and 14(b) are views for explaining an influence of an antimagnetic field to an orientation of a magnetization of a magnetic film end portion.
Figure 14:
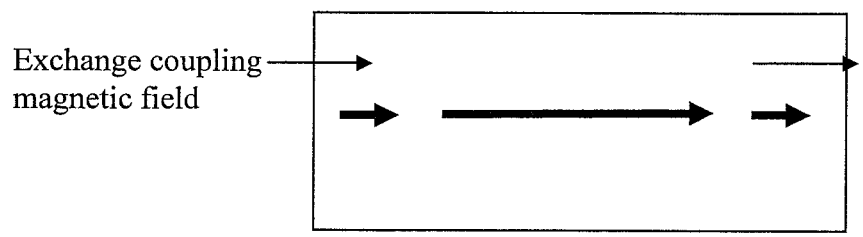

On the other hand, the following trouble may occur if the value of $J_{ex}$ is too large. According to Journal of Magnetism and Magnetic Materials, 159, L1-6 (1996), the magnitude of spin torque contributing to the spin torque magnetization reversal is proportional to $\sin\theta$ assuming that $\theta$ is an angle defined by the magnetization of the ferromagnetic layer 43 on the fixed layer side and the magnetization of the ferromagnetic layer 21 on the recording layer side. Therefore, the spin torque magnetization reversal never occurs when the magnetization of the ferromagnetic layer 43 on the fixed layer side and the magnetization of the ferromagnetic layer 21 on the recording layer side are completely parallel or antiparallel. Usually, when the recording layer is formed of a single layer, the magnetization at an end portion of the recording layer is influenced by an antimagnetic field $H_d$ and is slightly inclined relative to the easy axis as shown in FIG. 14. Accordingly, the spin torque magnetization reversal is started from this end portion and is spread to the entire recording layer. However, in the case of the laminated ferrimagnetic recording layer, the magnetization direction is oriented to the direction of the easy axis to the end portion when the large exchange coupling force is active. Therefore, the magnitude of the spin torque is small in every region on the recording layer and the spin torque magnetization reversal is unlikely to occur. The magnitude of the antimagnetic field that inclines the magnetization is expressed by $H_d \sim (M_s/\mu_0)(w/t)$ (in which w is a length of a short side of the recording layer). Hence the exchange coupling energy $J_{ex}$ needs to satisfy the following:

$$M_S^2(t/w) > |J_{ex}|$$

In this way, the above-mentioned formula (3) is derived as the value range to be satisfied by the exchange coupling energy $J_{ex}$.

Next, electrical characteristics of the manufactured element were measured. Results are shown on Table 1. On Table 1, numerical values in parentheses ( ) appearing in film compositions represent film thicknesses in the unit of nm. Here, a positive current direction is a direction of a current flowing from the fixed layer 4 toward the recording layer 2. At this time, the magnetization direction of the ferromagnetic film 21 opposed to the fixed layer 4 via the nonmagnetic barrier layer 3 is subjected to the magnetization reversal from the parallel direction to the antiparallel direction relative to the magnetization direction of the fixed layer 4. On the other hand, when the current is supplied in a negative direction, the magnetization direction of the ferromagnetic layer 21 opposed to the fixed layer 4 via the nonmagnetic barrier layer 3 is subjected to the magnetization reversal from the antiparallel direction to the parallel direction relative to the magnetization direction of the fixed layer 4. Values of $J_{c0}$ shown on Table 1 represent arithmetic averages of $J_{c0}$ in the spin torque magnetization reversal in both the magnetization reversal from the parallel direction to the antiparallel direction and the magnetization reversal from the antiparallel direction to the parallel direction. The heat treatment temperature is set to 350° C. in each case. In each of the elements, the TMR ratio was equal to about 200% and areal resistance was equal to about 10 $\Omega\mu m^2$. Here, Table 1 only shows measurement results of the element subjected to the heat treatment at 350° C. However, when an element subjected to the heat treatment at 300° C. is measured separately, the TMR ratio thereof is around 100%. In comparison between FIG. 4 and FIG. 5, the element subjected to the heat treatment at 300° has larger exchange coupling energy. However, the element subjected to the heat treatment at 350° C. has a higher TMR ratio.

Assuming that the Δ value required for a system is equal to 60, the value of $J_{ex}$ needs to be equal to or above 0.025 mJ/m² when the element size (the element area) S is defined as 100 nm×200 nm=20000 nm². Meanwhile, the saturated magnetization of $Co_{20}Fe_{60}B_{20}$ is equal to 1.4 T while the film thickness thereof is equal to 2 nm. Therefore, the value of $J_{ex}$ needs to be equal to or below 39.2 mJ/m² based on the formula (3). On the right column of Table 1, a case which satisfies two conditions of the formula (3) is indicated with ○ while a case which does not satisfy the two conditions is indicated with x. An operating temperature of the magnetic memory was set to T=300 K.

TABLE 1

Characteristics of TMR Element

| Film Composition | $J_{ex}$ (mJ/m²) | $J_{c0}$ (MA/cm²) | $E/k_B T$ | Conditions of Formula (3) |
|---|---|---|---|---|
| $Co_{20}Fe_{60}B_{20}(2)/Ru(0.7)/Co_{20}Fe_{60}B_{20}(1.8)$ | −0.01 | 4.0 | 35 | x |
| $Co_{20}Fe_{60}B_{20}(2)/Ru(0.8)/Co_{20}Fe_{60}B_{20}(1.8)$ | −0.04 | 2.0 | 60 | ○ |
| $Co_{20}Fe_{60}B_{20}(2)/Ru(0.9)/Co_{20}Fe_{60}B_{20}(1.8)$ | −0.015 | 3.5 | 40 | x |
| $Co_{20}Fe_{60}B_{20}(2)/Ru(0.7)/Co_{50}Fe_{50}(2.0)$ | −0.08 | 1.5 | 60 | ○ |
| $Co_{20}Fe_{60}B_{20}(2)/Ru(0.8)/Co_{50}Fe_{50}(1.8)$ | −0.15 | 1 | 85 | ○ |
| $Co_{20}Fe_{60}B_{20}(2)/Ru(0.9)/Co_{50}Fe_{50}(1.8)$ | −0.07 | 1.5 | 60 | ○ |

As seen from these results, it is confirmed that $J_{c0}$ is decreased whereas $E/k_B T$ is increased when the exchange coupling energy is stronger, and it is possible to satisfy a specification of Δ being equal to or above 60 only when the formula (3) is met. This is likely to be because the magnetizations of the two ferromagnetic layers 21 and 23 forming the laminated ferrimagnetic recording layer are firmly set parallel by the strong exchange coupling force when the exchange coupling power is strong. Although Table 1 only shows limited material compositions of $Co_{20}Fe_{60}B_{20}/Ru/Co_{20}Fe_{60}B_{20}$ and $Co_{20}Fe_{60}B_{20}/Ru/Co_{50}Fe_{50}$, it is also possible to use $Co_xFe_yB_z$ as the material of the ferromagnetic layers and to use a material such as Ir, Os or Cr for the nonmagnetic film instead of Ru.

Table 2 shows an example when $Co_{40}Fe_{40}B_{20}/Ru/Co_{40}Fe_{40}B_{20}$ is used. The element size is defined as 100 nm×200 nm in each case and the heat treatment temperature is set to 350° C. Assuming that the Δ value required for the system is equal to 60, the value of $J_{ex}$ needs to be equal to or above 0.025 mJ/m² based on the formula (3) when the element size is defined as 100 nm×200 nm=20000 nm². Meanwhile, the saturated magnetization of $Co_{20}Fe_{60}B_{20}$ is equal to 1.0 T while the film thickness thereof is equal to 2 nm. Therefore, the value of $J_{ex}$ needs to be equal to or below 28 mJ/m² based on the formula (3). The state of satisfaction of these two conditions is indicated on the right column of Table 2.

TABLE 2

Characteristics of TMR Element

| Film Composition | $J_{ex}$ (mJ/m²) | $J_{c0}$ (MA/cm²) | $E/k_B T$ | Conditions of Formula (3) |
|---|---|---|---|---|
| $Co_{40}Fe_{40}B_{20}(2)/Ru(0.7)/Co_{40}Fe_{40}B_{20}(1.8)$ | −0.03 | 4.0 | 60 | ○ |
| $Co_{40}Fe_{40}B_{20}(2)/Ru(0.8)/Co_{40}Fe_{40}B_{20}(1.8)$ | −0.12 | 3.5 | 80 | ○ |
| $Co_{40}Fe_{40}B_{20}(2)/Ru(0.9)/Co_{40}Fe_{40}B_{20}(1.8)$ | −0.03 | 4.5 | 60 | ○ |

On Table 2, it is confirmed that all the elements satisfy the formula (3) but this fact does not change the tendency that $J_{c0}$ is decreased whereas $E/k_B T$ is increased when the exchange coupling energy is stronger. However, it is confirmed that the value of $J_{c0}$ becomes greater in the case of using $Co_{40}Fe_{40}B_{20}$ than in the case of using $Co_{20}Fe_{60}B_{20}$.

Next, elements having the element size S of 65×130 nm are manufactured in accordance with the same film compositions as those on Table 1 and are evaluated. The heat treatment temperature is set to 350° C. Results are shown on Table 3. The value of $J_{ex}$ needs to be equal to or above 0.066 mJ/m$^2$ based on the formula (3). Meanwhile, the saturated magnetization of $Co_{20}Fe_{60}B_{20}$ is equal to 1.4 T while the film thickness thereof is equal to 2 nm. Therefore, the value of $J_{ex}$ needs to be equal to or below 39.2 mJ/m$^2$ based on the formula (3). The state of satisfaction of these two conditions is indicated on the right column of Table 3.

TABLE 3

Characteristics of TMR Element

| Film Composition | $J_{ex}$ (mJ/m$^2$) | $J_{c0}$ (MA/cm$^2$) | E/k$_B$T | Conditions of Formula (3) |
|---|---|---|---|---|
| $Co_{20}Fe_{60}B_{20}(2)$/Ru(0.7)/$Co_{20}Fe_{60}B_{20}(1.8)$ | −0.01 | 4.0 | 18 | x |
| $Co_{20}Fe_{60}B_{20}(2)$/Ru(0.8)/$Co_{20}Fe_{60}B_{20}(1.8)$ | −0.04 | 3.0 | 25 | x |
| $Co_{20}Fe_{60}B_{20}(2)$/Ru(0.9)/$Co_{20}Fe_{60}B_{20}(1.8)$ | −0.015 | 4.0 | 15 | x |
| $Co_{20}Fe_{60}B_{20}(2)$/Ru(0.7)/$Co_{50}Fe_{50}(2.0)$ | −0.08 | 2 | 60 | ○ |
| $Co_{20}Fe_{60}B_{20}(2)$/Ru(0.8)/$Co_{50}Fe_{50}(1.8)$ | −0.15 | 1 | 85 | ○ |
| $Co_{20}Fe_{60}B_{20}(2)$/Ru(0.9)/$Co_{50}Fe_{50}(1.8)$ | −0.07 | 2 | 60 | ○ |

According to further detailed investigations, it was confirmed that the content of B is preferably set around z=20% (17% to 22%) when B is added to the ferromagnetic layers. Moreover, concerning the upper ferromagnetic layer 23, it was confirmed that the large exchange coupling energy $J_{ex}$ can be obtained when the layer does not contain B (z=0) and the value x is set in a range from 30% to 70%. In fact, the magnetic layer 21 on the MgO side of the recording layer is fixed to $Co_{20}Fe_{60}B_{20}$ with which a smaller $J_{c0}$ can be obtained. Meanwhile, the Ru film thickness that maximizes the exchange coupling energy is found by changing the x value and changing the film thickness of Ru. Hence the exchange coupling energy in the optimized Ru film thickness was obtained as follows, namely, $J_{ex}$=−0.04 (mJ/m$^2$) when x=0%, $J_{ex}$=−0.04 (mJ/m$^2$) when x=20%, $J_{ex}$=−0.08 (mJ/m$^2$) when x=30%, $J_{ex}$=−0.15 (mJ/m$^2$) when x=50%, $J_{ex}$=−0.08 (mJ/m$^2$) when x=70%, and $J_{ex}$=−0.08 (mJ/m$^2$) when x=90%.

Meanwhile, fluctuations of $J_{c0}$ and E/k$_B$t inside a 3-inch (80-mm) wafer were evaluated. As a result, fluctuations of TMR elements loading $Co_{20}Fe_{60}B_{20}$ (2)/Ru (0.8)/$Co_{50}Fe_{50}$ (1.8) having the smallest $J_{c0}$ and the large $J_{ex}$ are reduced by half or below as compared to fluctuations of TMR loading $Co_{20}Fe_{60}B_{20}$ (2)/Ru (0.7)/$Co_{20}Fe_{60}B_{20}$ (1.8) having the small $J_{ex}$. From this fact, it was confirmed that the increase in the exchange coupling also has a significant effect of reducing the fluctuations in the wafer surface of the laminated ferrimagnetic recording layer.

Second Embodiment

Figure 8:
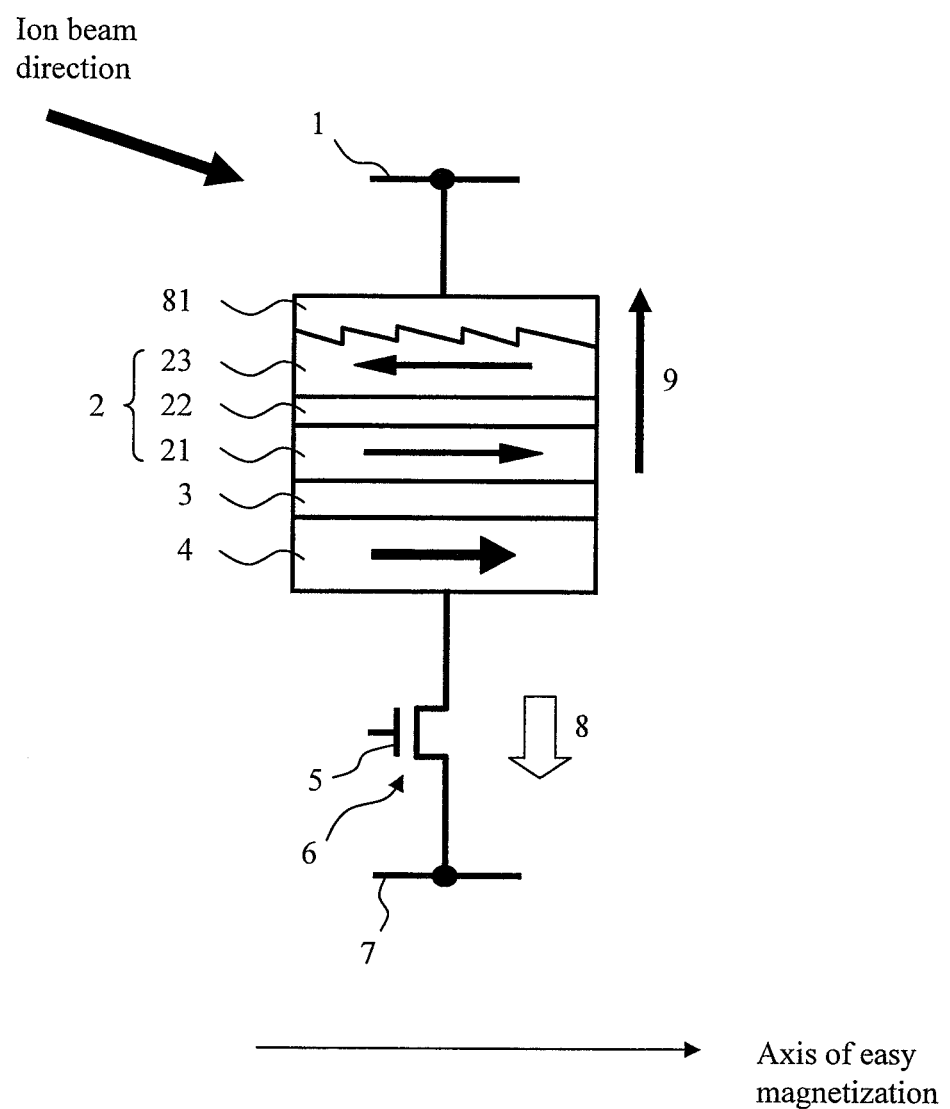
FIG. 8 is a view showing a second embodiment of the present invention.

An embodiment of adding a texture to the upper ferromagnetic layer 23 of the laminated ferrimagnetic recording layer will be described. FIG. 8 shows the example in which the ferromagnetic layer 23 is provided with the texture in the direction of the axis of easy magnetization by use of an appropriate means and a cap layer 81 made of a metallic material is provided thereon. The direction of a periodic structure of texture grooves is substantially perpendicular to the direction of the axis of easy magnetization of the ferromagnetic layer 23.

With the configuration described above, an antimagnetic field attributable to this microstructure has a function to prevent rotation of the magnetization in the direction perpendicular to the direction of the axis of easy magnetization (i.e., in the direction of the axis of hard magnetization), thereby increasing magnetic anisotropy. As for the material of the cap layer, a material having a high melting point and a low resistance such as Ru or Ta is desirable. The size of irregularities on the texture can be evaluated by average roughness Ra. The Ra is an average amount of the size of the irregularities measured by line scanning with an atomic force microscope based on a length of a scanned line. In this embodiment, the Ra before the texture is provided is equal to about 0.08 nm. To provide the texture, light ion beam etching for forming the texture is performed by projecting a beam from obliquely above the TMR element.

Figure 13:
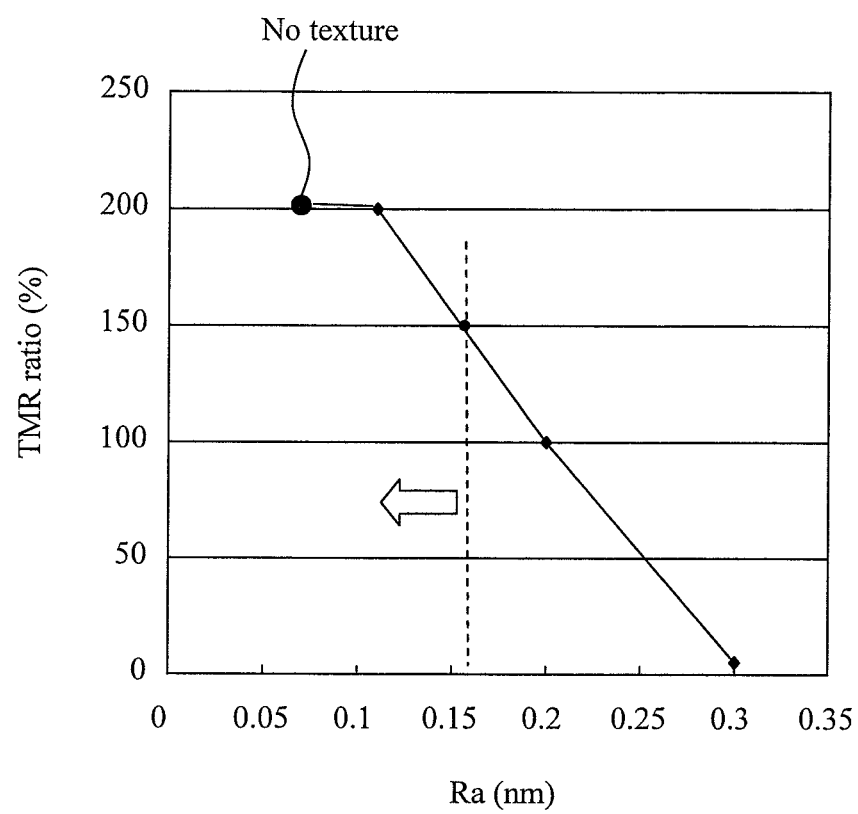
FIG. 13 is a graph showing a relationship between Ra and a TMR ratio.

FIG. 13 shows a relationship between the value Ra and the TMR characteristic. It is confirmed that the TMR ratio is sharply decreased by the increase in the Ra. Provision of the irregularities equivalent to Ra equal to or above 0.15 nm is not preferable because the irregularities damage not only the ferromagnetic layer 23 but also the ferromagnetic layer 21 and the nonmagnetic barrier layer 3, and thereby significantly deteriorate the characteristics of the TMR element. Japanese Patent Application Publication No. 2007-317734 discloses the capability of increasing the magnetic anisotropy by setting the Ra equal to or above 1.1 nm. However, as a result of detailed investigations of element manufacturing processes, the inventors have found out that it is possible both to increase the magnetic anisotropy and to maintain the large TMR ratio by setting the Ra equal to or below 0.15 nm.

When this texture is added, the ferromagnetic film 23 is provided with the strong magnetic anisotropy in the direction perpendicular to the grooves of the texture as described previously. Therefore, even if there is an influence of disturbance such as the leakage magnetic field from the fixed layer 4 or the like, the magnetization is always oriented to the direction perpendicular to the direction of the periodic structure of the grooves on the texture. Therefore, even if the fixed layer 4 is magnetized at a deviated angle relative to the longitudinal direction of the element as shown in FIG. 7(a), the magnetization of the ferromagnetic layer 23 is always oriented to the direction of the easy axis. Further, by adjusting the pitch of the texture, there is also an effect of increasing the exchange coupling energy of the recording layer 21 and the ferromagnetic layer 23. As a consequence, the orientations of the magnetizations of the ferromagnetic layer 23 and the ferromagnetic layer 21 satisfy $q_1$~$q_2$+180. On the other hand, in the case of FIG. 7(b), there is a small effect to directly orient the magnetization of the ferromagnetic layer 21 to the direction of the axis of easy magnetization. However, by applying the appropriate exchange coupling energy, this case has the same effect as the case in FIG. 7(a) that it is possible to orient the magnetization of the ferromagnetic layer 21 in the antiparallel direction to the ferromagnetic layer 23 of which the magnetization direction is directed to the long side of the TMR element, i.e., the direction of the axis of easy magnetization by the texture.

In order to manufacture the above-described element, it is important to set the longitudinal direction of the TMR element and the direction of the ion beam used in an etching process precisely parallel to each other. However, an ion bean etching apparatus can set a constant incident angle of the ion beam onto the element by increasing a distance between an ion gun and the element. Accordingly, it is much easier to precisely set the longitudinal direction of the TMR element and the direction of the ion bean used in the etching process precisely parallel to each other on the entire wafer surface by providing a high-precision substrate rotation mechanism than setting the longitudinal direction of the TMR element and in-plane magnetic field distribution for magnetizing the antiferromagnetic film to be constant. In this way, it is possible to form the TMR element using the laminated ferrimagnetic recording layer with less in-plane fluctuations of $J_{c0}$ and $E/k_B t$.

Furthermore, there is an effect that the value of $E/k_B t$ can be increased by using the ferromagnetic layer 23 subjected to texturing. Specifically, $E/k_B t$ of the entire laminated ferrimagnetic recording layer is increased because the magnetic anisotropy of the ferromagnetic layer 23 is improved.

The laminated ferrimagnetic recording layers having the same film compositions as those on Table 1 and being subjected to the heat treatment at 350° C. will be described below in detail. Structures of portions other than the ferromagnetic layer 23 and the cap layer are the same as the structure (FIG. 6) of the first embodiment. An angle between the ion beam and the substrate is set to 60 degrees and ion beam irradiation time is set to 100 seconds. Samples subjected to film formation and ion beam irradiation are cut into rectangles of 100 nm×200 nm and electrical characteristics are measured. The characteristics are shown on Table 4.

TABLE 4

Characteristics of TMR Element

| Film Composition | $J_{ex}$ (mJ/m²) | $J_{c0}$ (MA/cm²) | $E/k_B T$ | Conditions of Formula (3) |
|---|---|---|---|---|
| $Co_{20}Fe_{60}B_{20}(2)/Ru(0.7)/$ $Co_{20}Fe_{60}B_{20}(1.8)$ | −0.02 | 4.0 | 40 | x |
| $Co_{20}Fe_{60}B_{20}(2)/Ru(0.8)/$ $Co_{20}Fe_{60}B_{20}(1.8)$ | −0.065 | 2.0 | 60 | ◦ |
| $Co_{20}Fe_{60}B_{20}(2)/Ru(0.9)/$ $Co_{20}Fe_{60}B_{20}(1.8)$ | −0.03 | 3.5 | 40 | x |
| $Co_{20}Fe_{60}B_{20}(2)/Ru(0.7)/$ $Co_{50}Fe_{50}(2.0)$ | −0.10 | 1.5 | 110 | ◦ |
| $Co_{20}Fe_{60}B_{20}(2)/Ru(0.8)/$ $Co_{50}Fe_{50}(1.8)$ | −0.20 | 1 | 150 | ◦ |
| $Co_{20}Fe_{60}B_{20}(2)/Ru(0.9)/$ $Co_{50}Fe_{50}(1.8)$ | −0.10 | 1.5 | 100 | ◦ |

A required value of $|J_{ex}|$ estimated based on the formula (3) is equal to 0.062 (mJ/m²), and it is confirmed that a condition of $\Delta = E/k_B T > 60$ is satisfied when the conditions of the formula (3) are satisfied. Specifically, by achieving the $J_{ex}$ satisfying the formula (3) shown in the first embodiment and further adding the structure provided with the texture as described in this embodiment, the directions of the two magnetizations of the recording layer are rendered extremely stable in the antiparallel state. Hence it is possible to achieve significant thermal stability. Meanwhile, fluctuations of $J_{c0}$ and $E/k_B T$ inside the 3-inch (80-mm) wafer are evaluated and it was confirmed that the fluctuations are almost equal to the fluctuations of the TMR element loading $Co_{20}Fe_{60}B_{20}$ (2)/Ru (0.8)/$Co_{50}Fe_{50}$ (1.8) without the texture. It was also confirmed that irradiation of the ion beam does not adversely affect the fluctuations. Here, only the material composition of $Co_{20}Fe_{60}B_{20}/Ru/Co_{50}Fe_{50}$ is demonstrated in particular. However, the effect was not changed by using $Co_x Fe_y B_z$ having the B content around z=20% as the material of the ferromagnetic layers and using a material such as Ir, Os or Cr for the nonmagnetic layer instead of Ru. Nevertheless, as a result of investigation, it was confirmed that the content of B is preferably set around z=20% (17% to 22%) when B is added. Moreover, concerning the upper ferromagnetic layer 23, it was confirmed that the large exchange coupling energy $J_{ex}$ can be obtained when the layer does not contain B (z=0) and the value x is set in the range from 30% to 70%.

Figure 9:
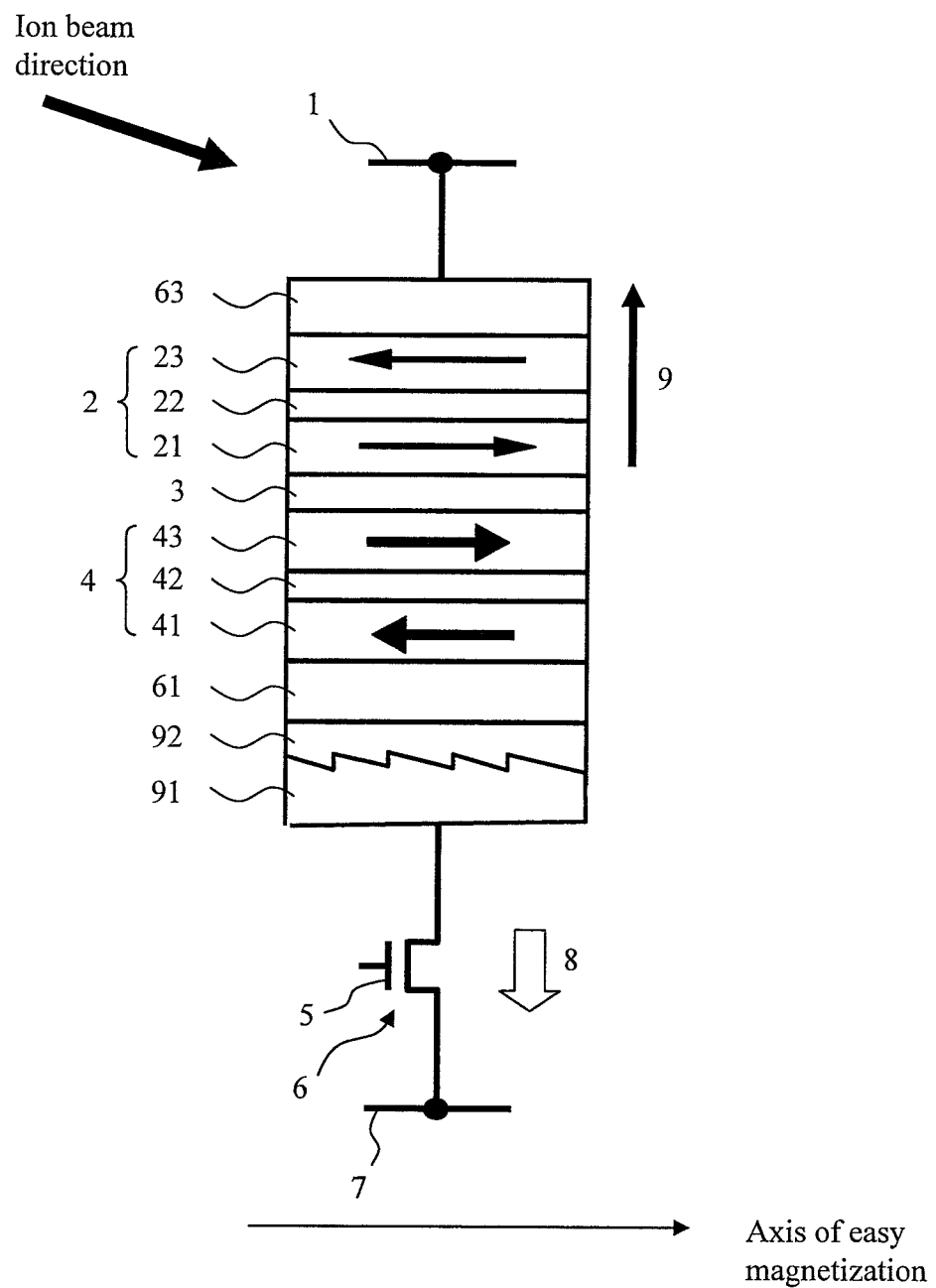
FIG. 9 is a view showing a second embodiment of the present invention.
Figure 10:
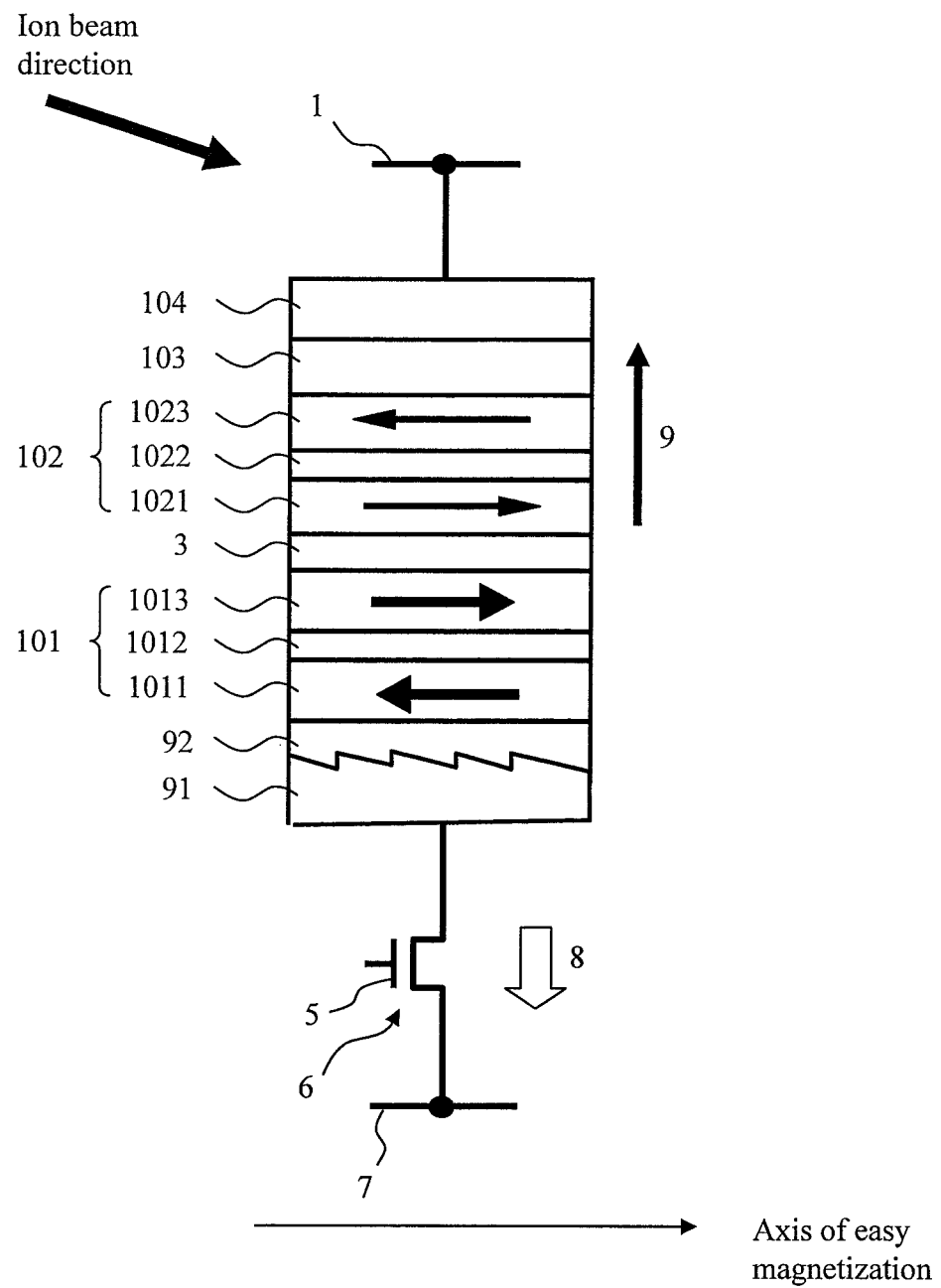
FIG. 10 is a view showing a second embodiment of the present invention.

Although the embodiment of providing the uppermost layer of the laminated ferrimagnetic free layer has been described above, it is also possible to achieve an effect of satisfying $q_1 \sim q_2 + 180$ by adding textures to a substrate 91 and a foundation layer 92 as shown in FIG. 9. This effect can be achieved even when the laminated ferrimagnetic recording layer 2 is located above the nonmagnetic barrier layer 3 as shown in FIG. 9. However, it is more effective when a laminated ferrimagnetic recording layer 101 is located below the nonmagnetic barrier layer 3 as shown in FIG. 10. As for concrete configurations of materials in this case, the laminated ferrimagnetic free layer 101 having a structure of $Co_{50}Fe_{50}/Ru/Co_{20}Fe_{60}B_{20}$ is formed by laminating a ferromagnetic layer 1011, a nonmagnetic layer 1012, and a ferromagnetic layer 1013 on the foundation layer 92 provided with a texture, for example. The nonmagnetic barrier layer 3 made of MgO is formed thereon. Then, a laminated ferrimagnetic fixed layer 102 having a structure of $Co_{20}Fe_{60}B_{20}/Ru/Co_{50}Fe_{50}$ is formed by laminating a ferromagnetic layer 1021, a nonmagnetic layer 1022, and a ferromagnetic layer 1023 thereon. Moreover, an antiferromagnetic layer 103 made of IrMn, for example, and a cap layer 104 are formed. After a heat treatment is performed at the heat treatment temperature of 350° C. and the structure is processed into a rectangle of 100 nm×200 nm, electrical characteristics are measured. An element having similar characteristics to the sample in FIG. 8 is obtained.

Third Embodiment

Next, a description will be given of a method of providing an additional magnetic layer on the TMR element and setting two magnetization angles of the laminated ferrimagnetic free layer so as to satisfy $q_1 \sim q_2 + 180$ by utilizing a leakage magnetic field from the additional magnetic layer.

Figure 11:
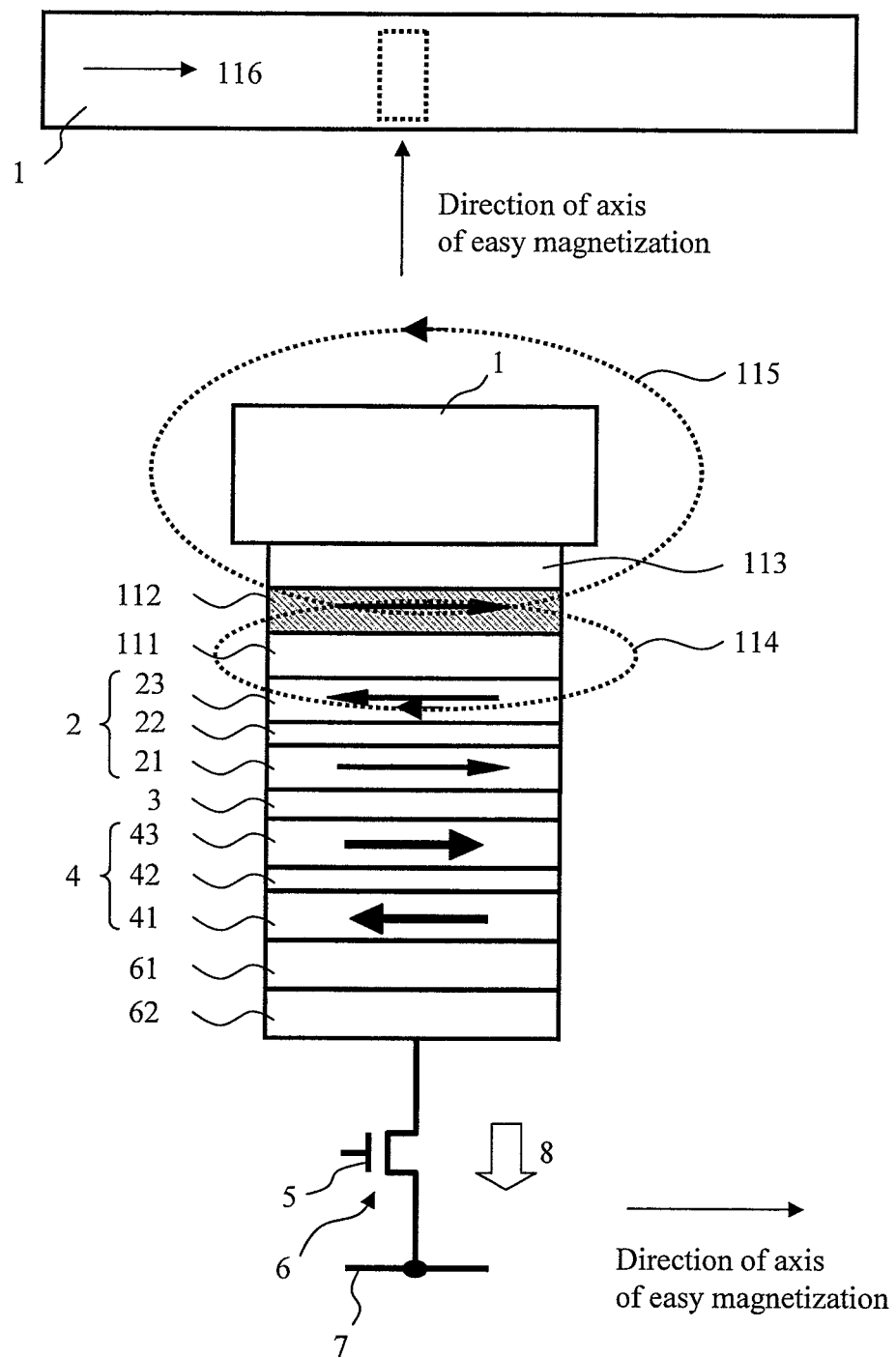
FIG. 11 is a view showing a third embodiment of the present invention.

In FIG. 11, reference numeral 111 denotes a cap layer, reference numeral 112 denotes an additional magnetic layer, reference numeral 113 denotes a conductive intermediate layer, reference numeral 116 denotes a current flowing through the bit line 1, reference numeral 115 denotes a magnetic field generated by the current through the bit line 1, and reference numeral 114 denotes a magnetic field generated by the magnetization of the additional magnetic layer 112. Other configurations are the same as those in FIG. 6. Although a soft magnetic material such as NiFe is desirable as the material of the additional magnetic layer 112, an alloy of any of Co, Ne, and Fe is used in a broader sense. As will be described later, this is because the magnetization of the additional magnetic layer 112 has to be switched by 180 degrees by switching the direction of the current 116 flowing through the bit line 1. FIG. 11 shows a writing operation when the magnetization of the magnetic layer 21 on the nonmagnetic barrier layer 3 side of the laminated ferrimagnetic recording layer 2 and the magnetization of the magnetic layer 43 on the nonmagnetic barrier layer 3 side of the fixed layer 4 are shifted from the antiparallel state to the parallel state. Specifically, a gate 5 of a transistor 6 is turned on so as to supply a current 8 from the bit line 1 to a source line 7. At this time, the current tries to flow through the bit line 1 in a direction of an arrow 116. Then, the magnetization of the magnetic layer 21 is set to the parallel direction to the magnetization of the magnetic layer 43 as shown in FIG. 11 by the spin torque magnetization reversal and the magnetization of the additional magnetic layer 112 is magnetized by the magnetic field 115 generated by the current 116 flowing through the bit line as shown in FIG. 11. After the gate is turned off to shut off the current, the magnetization direction of the additional magnetic layer 42 is retained and the magnetic field 114 is applied from the additional magnetic layer 42 in the direction of the easy axis of the laminated ferrimagnetic free layer. Due to this effect, the magnetization of the magnetic layer 23 is oriented to the direction of the axis of easy magnetization by an effect of the magnetic field 114 even if the relationship of $q_1 \sim q_2 + 180$ is no longer satisfied due to a manufacturing error. This magnetic field has a limited effect to directly orient the magnetization of the ferromagnetic layer 21 to the direction of the axis of easy magnetization. However, it is possible by the appropriate exchange coupling energy to orient the magnetization of the ferromagnetic layer 21 in the antiparallel direction to the ferromagnetic layer 23 oriented in the direction of the axis of easy magnetization.

Meanwhile, the gate 5 of the transistor 6 is turned on so as to supply the current 8 from the source line 7 to the bit line 1 for performing a writing operation of the case where the magnetization of the magnetic layer 21 on the nonmagnetic barrier layer 3 side of the laminated ferrimagnetic recording layer 2 and the magnetization of the magnetic layer 43 on the nonmagnetic barrier layer 3 side of the fixed layer 4 are shifted from the parallel state to the antiparallel state. At this time, the current flows through the bit line 1 in an opposite direction to the arrow 116. Then, the magnetization of the magnetic layer 21 is changed from the state in FIG. 11 to the antiparallel direction to the magnetization of the magnetic layer 43 by the spin torque magnetization reversal and the magnetization of the additional magnetic layer 112 is magnetized in the opposite direction to the orientation of the magnetization of the additional magnetic layer 112 shown in FIG. 11 by the magnetic field 115 (in the opposite direction, i.e., clockwise in this case) generated by the current 116 flowing through the bit line. After the gate is turned off to shut off the current, the magnetization direction of the additional magnetic layer 112 is retained and the magnetic field 114 (in the opposite direction: counterclockwise) is applied from the additional magnetic layer 112 in the direction of the easy axis of the laminated ferrimagnetic free layer 2. Due to this effect, the magnetization of the magnetic layer 23 is oriented to the direction of the axis of easy magnetization by the effect of the magnetic field 114 even if the relationship of $q_1 \sim q_2 + 180$ is no longer satisfied due to the manufacturing error. This magnetic field has a limited effect to directly orient the magnetization of the ferromagnetic layer 21 to the direction of the axis of easy magnetization. However, as similar to the second embodiment, it is possible by the appropriate exchange coupling energy to orient the magnetization direction of the ferromagnetic layer 21 in the antiparallel direction to the ferromagnetic layer 23 oriented in the direction of the axis of easy magnetization.

Thicknesses of the additional magnetic layer 112 and the cap layer 111 are important parameters for determining an effect to orient the ferromagnetic layer 23 in the direction of the axis of easy magnetization in this embodiment. As described previously, the alloy of any of Co, Fe, and Ni is mainly used as the material of the additional magnetic layer 112. When $Ni_{80}Fe_{20}$ is used, for example, the film thickness is set preferably equal to or above 10 nm because the additional magnetic layer 112 needs to be thermally stable. Metal such as Cu, Mo, Ti, Ta, Zr or Nb or an alloy of any of these elements is used as the material of the conductive intermediate layer 113. The thickness of the cap layer 111 is preferably set to a thickness which does not cause antiferromagnetic coupling between the additional magnetic layer 112 and the ferromagnetic layer 23, or namely at least equal to or above 2 nm. Meanwhile, it is preferable to set the thickness equal to or below 10 nm in order to supply a sufficient magnetic field from the additional magnetic layer 112 to the ferromagnetic layer 23.

Fourth Embodiment

Figure 12:
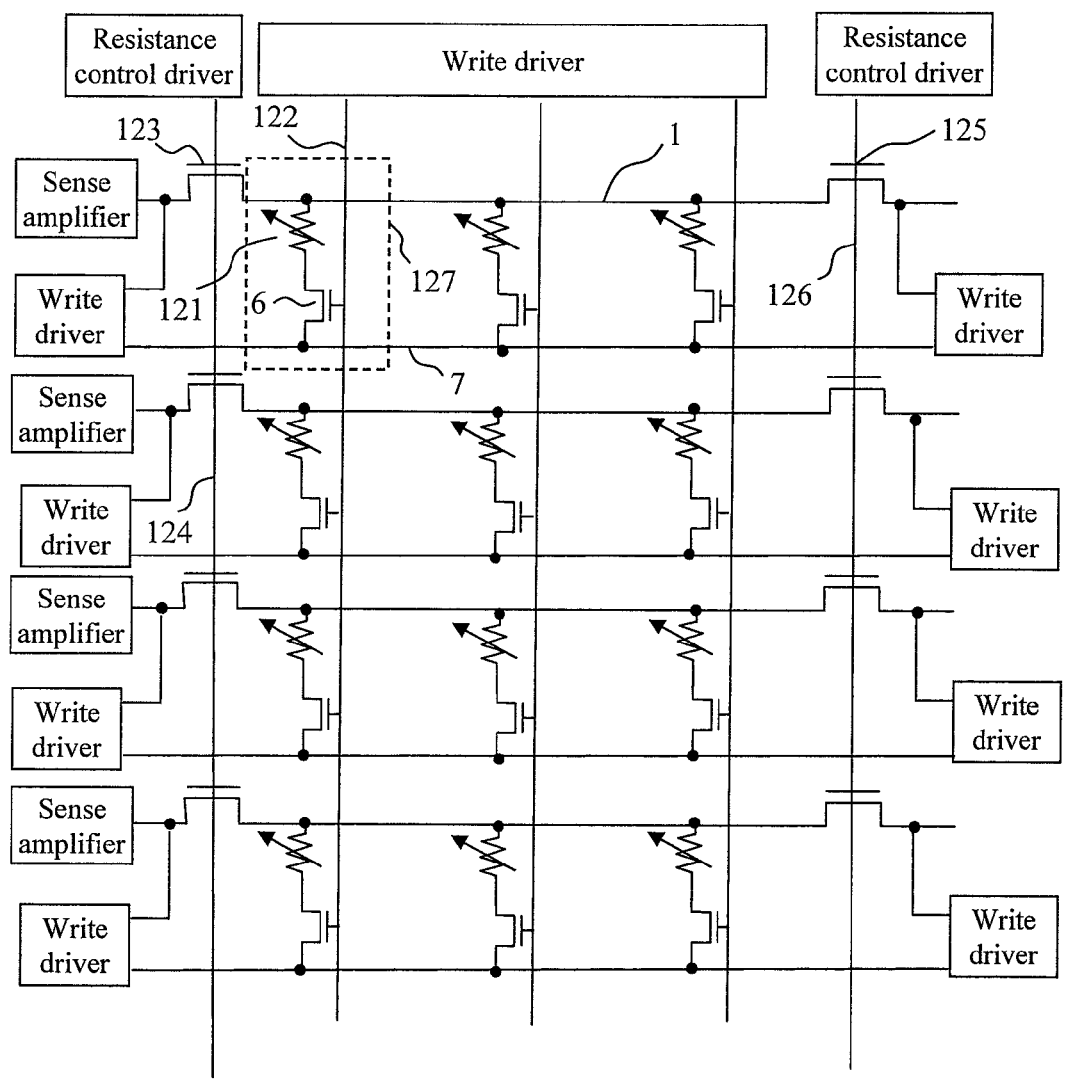
FIG. 12 is a view showing an example of a memory array circuit according to the present invention.

Next, an example of a memory circuit according to the present invention will be described by using FIG. 12. In FIG. 12, reference numeral 1 denotes the bit line, reference numeral 121 denotes a TMR element having any one of the structures according to the first to third embodiments, reference numeral 7 denotes the source line, reference numeral 6 denotes a cell selection transistor, reference numeral 122 denotes a word line, and reference numeral 127 denotes one memory cell. Reference numerals 123 and 125 denote resistance change elements (transistors in this case) configured to control the magnitude of the current to be supplied to the bit line, and reference numerals 124 and 126 denote word lines for controlling resistance for controlling conduction states of the resistance change elements 123 and 125.

As for writing in the case of this configuration, when writing is performed in the cell 127, for example, a write enable signal is firstly sent to a write driver connected to the bit line 1 for supplying the current so as to boost the driver, and then a predetermined current is supplied to the bit line 1 by controlling a voltage on a resistance control driver. Depending on the direction of the current, any of a write driver connected to the resistance change element 123 to a write driver connected to the resistance change element 125 is dropped to a ground level, and then the direction of the current is controlled by adjusting a potential difference. Next, after a lapse of a predetermined time period, the write enable signal is sent to a write driver connected to the word line to boost the write driver, and the transistor 6 is thereby turned on. Thus, the current is supplied to the TMR element, and spin torque magnetization reversal is performed. After the transistor 6 is left turned on for a predetermined time period, the signal to the write driver is cut off so as to turn the transistor 6 off. When reading is performed, only the bit line 1 connected to a memory cell to be read out is boosted to a read voltage V, then the transistor 6 is turned on and the current is supplied by selecting only the source line connected to the selected transistor 6 by using another write driver, and then reading is performed by amplifying a voltage difference applied on both ends of a resistor of the TMR element with a sense amplifier. In this case, the orientation of the current at the time of reading is always set in the direction from the source line 7 to the bit line 1. In this way, it is possible to reduce erroneous writing by the read current, to feed a larger read current, and thereby to perform high-speed reading. Since this structure employs the simplest 1-transistor+1-memory cell layout, the area occupied by a unit cell can achieve high integration of $2F \times 4F = 8F^2$.

The invention claimed is:
1. A magnetic memory comprising:
a magnetoresistive effect element formed by sequentially stacking a fixed layer, a nonmagnetic barrier layer, and a recording layer,
the recording layer including a first ferromagnetic layer, a nonmagnetic layer, and a second ferromagnetic layer, the first ferromagnetic layer being antiferromagnetically coupled with the second ferromagnetic layer via the nonmagnetic layer, the magnetic memory being configured to record information based on a relationship between a magnetization direction of the first ferromagnetic layer disposed on the nonmagnetic barrier layer side among the first and second ferromagnetic layers and a magnetization direction of the fixed layer, and the magnetic memory being configured to switch a magnetization direction of the recording layer using a spin-polarized current applied in a direction perpendicular to a film surface of the recording layer, wherein the magnetic memory satisfies the following expression:

$$M_s^2(t/w) > |J_{ex}| > (2k_B T\Delta)/S$$

in which $k_B$ is a Boltzmann constant, T is an operating temperature of the magnetic memory, S is an area parallel to a film surface of the magnetoresistive effect element, t and $M_s$ are respectively a film thickness and a saturated magnetization of the ferromagnetic layer having a smaller film thickness among the first ferromagnetic layer and the second ferromagnetic layer, w is a length of a short side of the recording layer, $\Delta$ is a thermal stability index of the magnetic memory, and $J_{ex}$ is exchange coupling energy acting between the first ferromagnetic layer and the second ferromagnetic layer.

2. The magnetic memory according to claim 1, wherein an antiferromagnetic layer is formed in contact with a surface of the fixed layer on a side opposite to the recording layer.

3. The magnetic memory according to claim 2, wherein the fixed layer comprises two ferromagnetic layers with a nonmagnetic intermediate layer interposed therebetween, and the two ferromagnetic layers are antiferromagnetically coupled with each other via the nonmagnetic layer.

4. The magnetic memory according to claim 1, wherein the fixed layer is made of CoFeB,
the nonmagnetic barrier layer is made of MgO,
the first ferromagnetic layer is made of CoFeB, and
the second ferromagnetic layer is made of $Co_x Fe_{(1-x)}$ in which x is in a range from 0.3 to 0.7.

5. The magnetic memory according to claim 1, wherein a transistor configured to apply electricity to the magnetoresistive effect element is connected to an end of the magnetoresistive effective element.

6. The magnetic memory according to claim 5, wherein an end of the transistor is connected to a source line being connected to a first write driver circuit, an end of the magnetoresistive effect element on a side not connected to the transistor is connected to a bit line being connected to a second write driver and to an amplifier configured to amplify a read signal, a word line to control resistance of the transistor is provided, and the word line is connected to a third write driver.

7. The magnetic memory according to claim 6, wherein an axis of easy magnetization of the recording layer is substantially perpendicular to a direction of extension of the bit line.

8. The magnetic memory according to claim 6, further comprising:

a first variable resistance element connected to one end of the bit line;

a second variable resistance element connected to another end of the bit line;

a first voltage applying means used for changing resistance of the first variable resistance element; and a second voltage applying means used for changing resistance of the second variable resistance element, wherein in a writing operation, a magnetization of the recording layer is reversed by using spin torque generated by supplying a current between the first voltage applying means and the second voltage applying means and supplying a spin-polarized current between the bit line and the source line.

* * * * *